US010446752B2

United States Patent
Lin et al.

(10) Patent No.: US 10,446,752 B2
(45) Date of Patent: Oct. 15, 2019

(54) LIGHT-EMITTING DIODE DISPLAY DEVICE

(71) Applicant: InnoLux Corporation, Miao-Li County (TW)

(72) Inventors: Chun-Hsien Lin, Miao-Li County (TW); Ming-Chang Lin, Miao-Li County (TW); Tzu-Min Yan, Miao-Li County (TW); Tsau-Hua Hsieh, Miao-Li County (TW); Tung-Kai Liu, Miao-Li County (TW); Jui-Feng Ko, Miao-Li County (TW); Hui-Chieh Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/662,522

(22) Filed: Jul. 28, 2017

(65) Prior Publication Data

US 2018/0040822 A1 Feb. 8, 2018

Related U.S. Application Data

(60) Provisional application No. 62/394,225, filed on Sep. 14, 2016, provisional application No. 62/371,246, filed on Aug. 5, 2016.

(30) Foreign Application Priority Data

Apr. 17, 2017 (CN) .......................... 2017 1 0249088

(51) Int. Cl.
*H01L 51/00* (2006.01)
*H01L 27/28* (2006.01)
*H01L 27/32* (2006.01)
*H01L 21/48* (2006.01)

(52) U.S. Cl.
CPC .......... *H01L 51/0012* (2013.01); *H01L 27/28* (2013.01); *H01L 27/3211* (2013.01); *H01L 27/3276* (2013.01); *H01L 51/0024* (2013.01); *H01L 21/48* (2013.01); *H01L 51/0002* (2013.01)

(58) Field of Classification Search
CPC . H01L 51/0012; H01L 27/28; H01L 27/3211; H01L 21/48; H01L 51/0002; H01L 27/14618; H01L 27/14636; H01L 27/14603
See application file for complete search history.

(56) References Cited

U.S. PATENT DOCUMENTS

| | | | | |
|---|---|---|---|---|
| 5,696,389 A | * | 12/1997 | Ishikawa | ................ B82Y 20/00 257/773 |
| 5,998,232 A | * | 12/1999 | Maruska | ................ H01L 33/325 257/13 |
| 2009/0050926 A1 | * | 2/2009 | Suehiro | ................ H01L 33/486 257/100 |

* cited by examiner

*Primary Examiner* — Tucker J Wright
(74) *Attorney, Agent, or Firm* — McClure, Qualey & Rodack, LLP

(57) ABSTRACT

A light-emitting diode display device includes a light-emitting diode and a substrate. The light-emitting diode includes a central axis, and the substrate includes a first connecting portion and a second connecting portion. The central axis is extended through the first connecting portion. The second connecting portion is disposed outside of the first connecting portion and is spaced apart from the first connecting portion by a distance which is greater than zero, and the first connecting portion and the second connecting portion are respectively electrically connected to the light-emitting diode.

9 Claims, 17 Drawing Sheets

LIGHT-EMITTING DIODE DISPLAY DEVICE

CROSS REFERENCE TO RELATED APPLICATIONS

This application claims the benefit of U.S. Provisional Application No. 62/371,246 filed on Aug. 5, 2016, U.S. Provisional Application No. 62/394,225 filed on Sep. 14, 2016, and China Patent Application No. 201710249088.4, filed Apr. 17, 2017, the entirety of which are incorporated by reference herein.

BACKGROUND OF THE DISCLOSURE

Field of the Disclosure

The present disclosure relates to a light-emitting diode display device, and more particularly to a light-emitting diode display device assembled using fluid self-assembly technology.

Description of the Related Art

An electronic display device is an optoelectronic device capable of transforming electronic signals into a viewable image, so that a viewer can watch the information loaded in the electronic signals. Recently, electronic display devices such as liquid-crystal displays and Organic electroluminescence displays have become very popular.

A micro-light-emitting-diode display is an effective solution to the problem of how to reduce the volume of an electronic display device. In contrast to other types of display devices, the micro-light-emitting-diode display has the advantages of small size, high contrast, low power consumption, and fast response time.

However, the size of the micro-light-emitting diode is very small, so that the main problem in the manufacturing procedure is how to accurately and stably assemble every micro-light-emitting diode on a driving backplane of the display device.

Therefore, how to accurately and stably assemble every micro-light-emitting diode on a driving backplane is an important issue to be studied.

BRIEF SUMMARY OF THE DISCLOSURE

Accordingly, the disclosure provides a light-emitting diode display device, to solve the problems described above.

In some embodiments, the disclosure provides a light-emitting diode display device, including a light-emitting diode and a substrate. The light-emitting diode includes a central axis. The substrate includes a first connecting portion and a second connecting portion. The central axis of the light-emitting diode is extended through the first connecting portion. The second connecting portion is disposed outside of the first connecting portion and is spaced apart from the first connecting portion by a distance which is greater than zero, and the first connecting portion and the second connecting portion are respectively electrically connected to the light-emitting diode.

In some embodiments, the disclosure further provides a light-emitting diode display device including a substrate and a plurality of light-emitting diodes. The substrate includes a plurality of grooves, and an electrical contact is disposed in each of the grooves. The light-emitting diodes are configured to install in the grooves. Each of the light-emitting diodes includes a main body, a first contact, and a second contact. The first contact and the second contact are disposed on the main body, and the first contact and the second contact are respectively electrically connected to the substrate through the corresponding electrical contacts.

The disclosure provides a light-emitting diode display device applied to a display. The light-emitting diode display device includes a substrate having a plurality of grooves and a plurality of micro-light-emitting diodes. Each of the micro-light-emitting diodes can include at least one dielectric layer, so that the micro-light-emitting diode can be driven by an external electric field to move toward the corresponding groove during the fluid self-assembly procedure, so that the micro-light-emitting diode is correctly installed in the corresponding groove. The main body of the micro-light-emitting diode can also be a cuboid or a trapezoid, and the micro-light-emitting diode can be more accurately installed in the corresponding groove on the substrate due to this design.

In addition, a connecting pad in the groove (such as the first connecting portion) corresponding to the positive electrode of the micro-light-emitting diode can be configured to be a circular structure, and a connecting pad in the groove (such as the second connecting portion) corresponding to the negative electrode of the micro-light-emitting diode can be configured to be a ring structure, so that the positive electrode and the negative electrode of the micro-light-emitting diode can correctly contact the corresponding connecting pads when the micro-light-emitting diode is installed in the groove.

DETAILED DESCRIPTION OF THE ILLUSTRATIVE EMBODIMENTS

Figure 1:
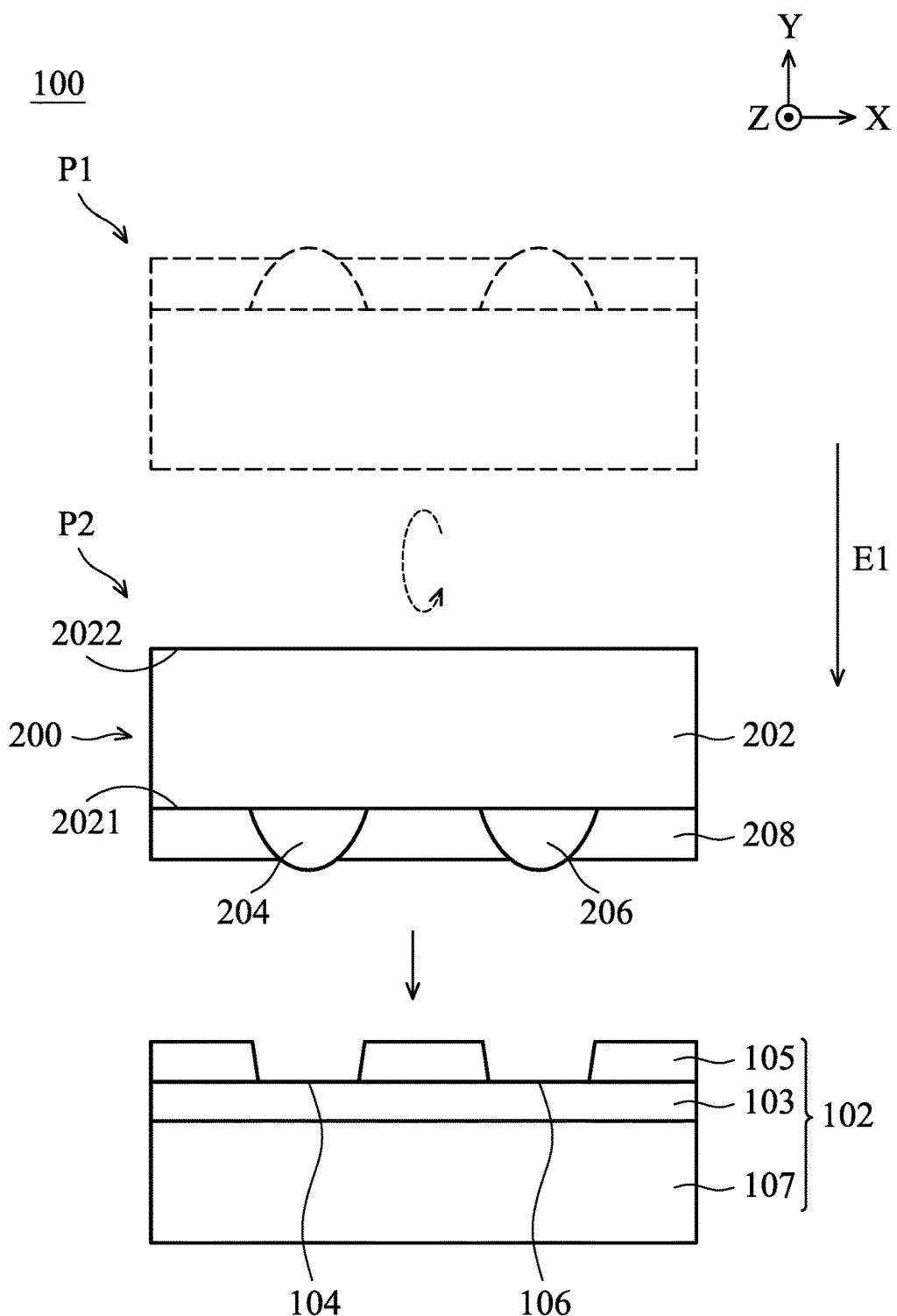
FIG. 1 is a diagram of a light-emitting diode display device according to the first embodiment of the disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

It should be understood that component for specific description or specific figures can be present in any forms with which the skilled person is familiar. In addition, when a layer is "above" other layers or a substrate, it might be "directly" on the layers or the substrate, or some other layers are between the layer and other layers.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

[The First Embodiment]

Please refer to FIG. 1, which is a diagram of a light-emitting diode display device 100 according to the first embodiment of the disclosure. In this embodiment, the light-emitting diode display device 100 includes a substrate 102 and a plurality of light-emitting diodes 200. Only one light-emitting diode 200 is illustrated in this embodiment for simplicity. Those light-emitting diodes 200 can be micro-light-emitting-diodes. The substrate 102 can include a driving circuit layer 103, an insulation layer 105 and a bottom layer 107. The driving circuit layer 103 is disposed on the bottom layer 107, and the insulation layer 105 is disposed on the driving circuit layer 103 and forms a plurality of grooves. Only two grooves 104 and 106 are illustrated in this embodiment for easy explanation. The light-emitting diode 200 is configured to be installed on the groove 104 and the groove 106, and the light-emitting diode 200 includes a main body 202, a first contact 204, a second contact 206 and a first dielectric layer 208. In this embodiment, the main body 202 is a cube or a cuboid, and the main body 202 includes a first side 2021 and a second side 2022. The first contact 204, the second contact 206 and the first dielectric layer 208 are disposed on the same side of the main body 202. For example, they can be disposed on the first side 2021 of the main body 202.

During the fluid self-assembly procedure, the light-emitting diode 200 and the substrate 102 is immersed in a fluid (not shown in the figures). At this time, the light-emitting diode 200 is located on a position P1 shown in FIG. 1, and the first contact 204 and the second contact 206 face upward. When an electric field E1 is applied to the light-emitting diode display device 100, the first dielectric layer 208 of the light-emitting diode 200 is induced and polarized, so that the first dielectric layer 208 correspondingly generates positive charges. Therefore, the polarized light-emitting diode 200 is driven by the electric field E1 to flip around the X axis to a position P2, and the light-emitting diode 200 continues to move toward the substrate 102. After that, the first contact 204 and the second contact 206 can be respectively joined with the groove 104 and the groove 106, so that the light-emitting diode 200 is installed on the substrate 102. At this time, the first contact 204 and the second contact 206 are respectively in contact with two electrical pads in the groove 104 and the groove 106, so that first contact 204 and the second contact 206 are electrically connected to the driving circuit layer 103 via the two electrical pads.

[The Second Embodiment]

Figure 2:
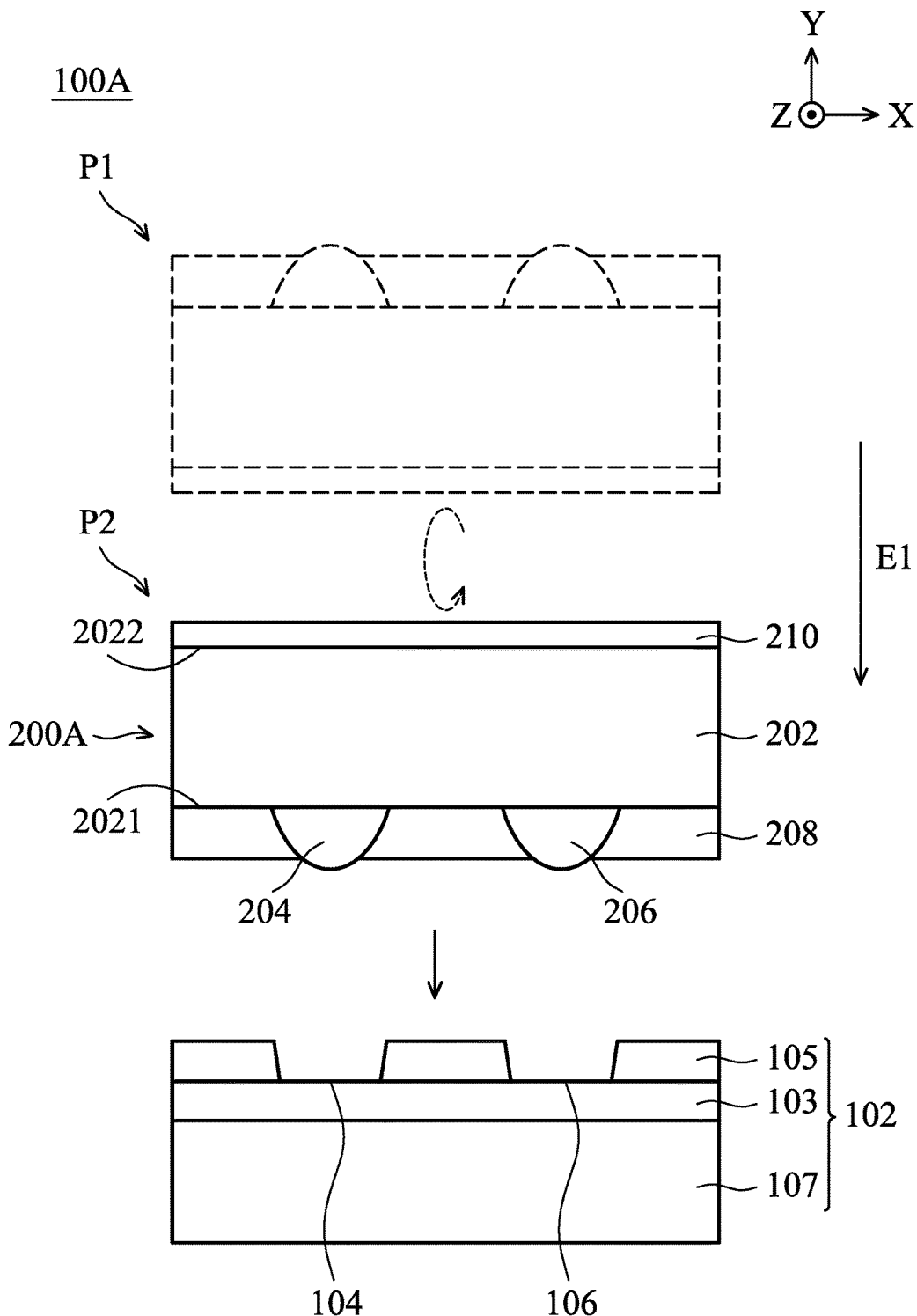
FIG. 2 is a diagram of a light-emitting diode display device according to the second embodiment of the disclosure.

Please refer to FIG. 2, which is a diagram of a light-emitting diode display device 100A according to the second embodiment of the disclosure. In contrast to the first embodiment, the light-emitting diode 200 A of the light-emitting diode display device 100A further includes a second dielectric layer 210, and the first dielectric layer 208 and the second dielectric layer 210 are disposed on opposite sides of the main body 202. For example, the first dielectric layer 208 is disposed on the first side 2021 of the main body 202, and the second dielectric layer 210 is disposed on the second side 2022 of the main body 202. The first dielectric layer 208 and the second dielectric layer 210 have different dielectric constants. In this embodiment, the dielectric constant of the first dielectric layer 208 is greater than the dielectric constant of the second dielectric layer 210.

During the fluid self-assembly procedure, the light-emitting diode 200A is originally located on the position P1 shown in FIG. 2, and the first contact 204 and the second contact 206 face upward. When an electric field E1 is applied to the light-emitting diode display device 100A, the first dielectric layer 208 and the second dielectric layer 210 of the light-emitting diode 200A are induced and polarized, so that the first dielectric layer 208 correspondingly generates positive charges, and the second dielectric layer 210 correspondingly generates negative charges. Therefore, the polarized light-emitting diode 200A is driven by the electric field E1 to flip around the X axis to the position P2, and the light-emitting diode 200 continues to move toward the substrate 102. After that, the first contact 204 and the second contact 206 can be respectively joined with the groove 104 and the groove 106, so that the light-emitting diode 200A is installed on the substrate 102.

[The Third Embodiment]

Figure 3:
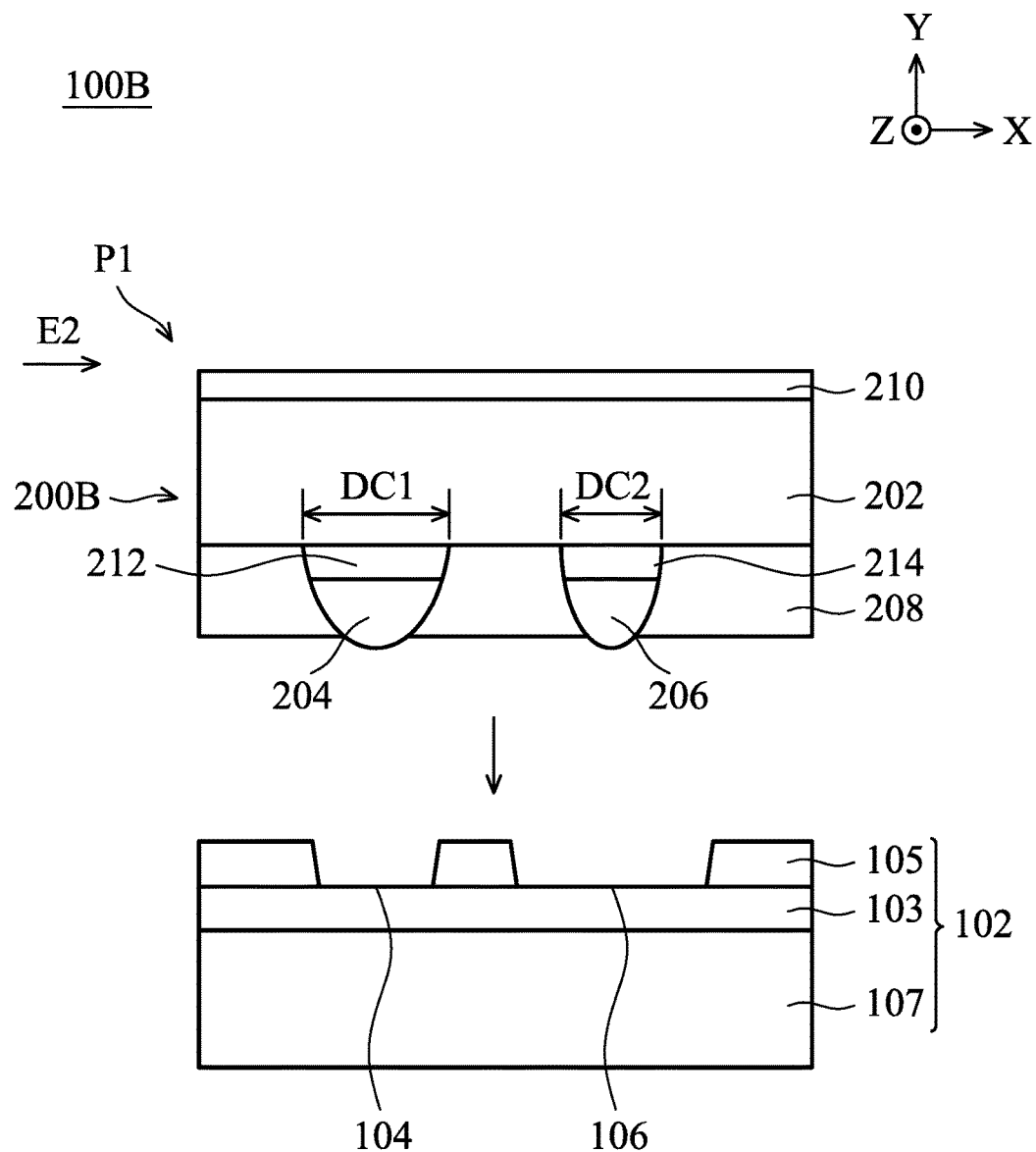
FIG. 3 and FIG. 4 are diagrams of a light-emitting diode display device according to the third embodiment of the disclosure.
Figure 4:
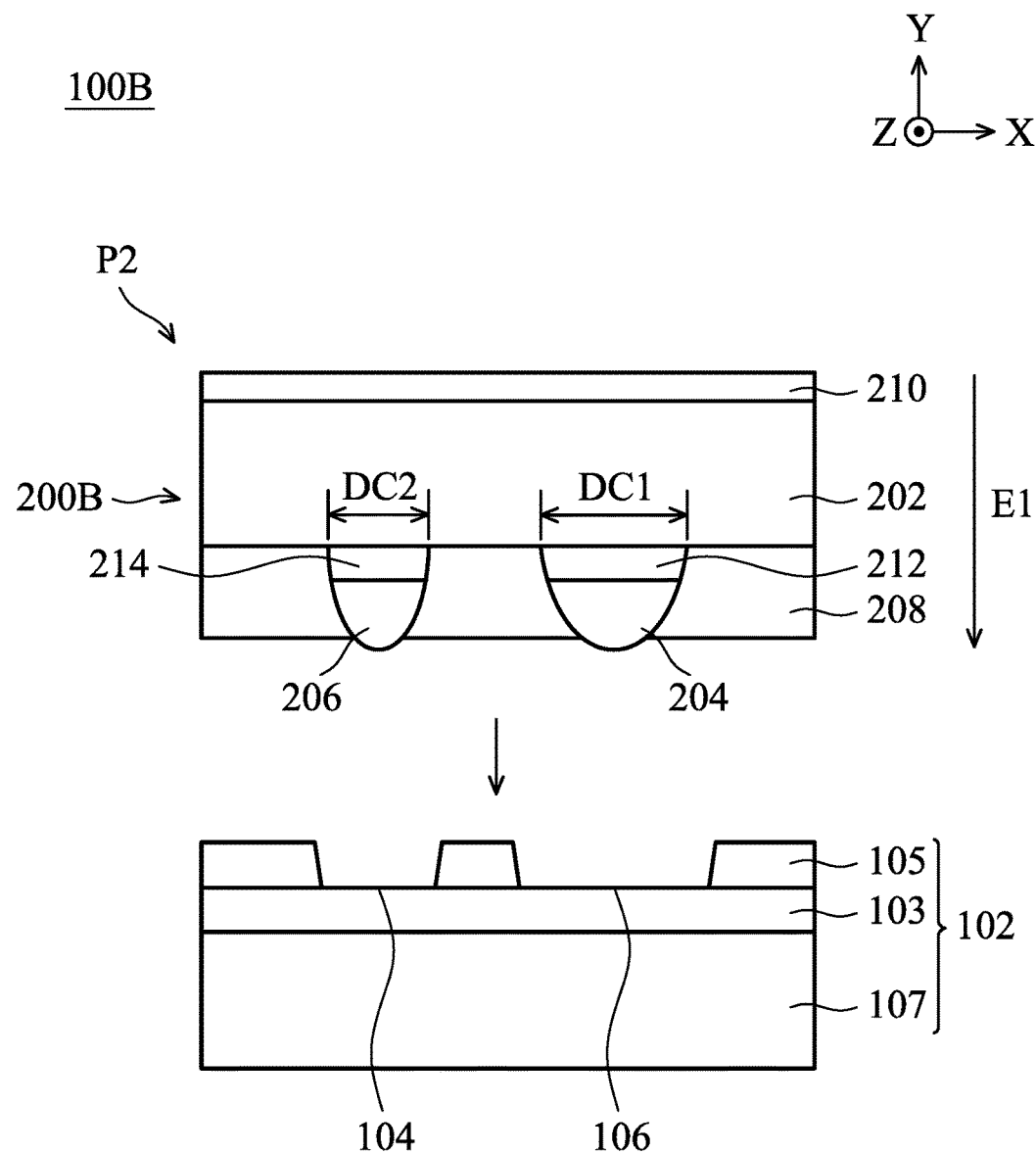

Please refer to FIG. 3 and FIG. 4, which are diagrams of a light-emitting diode display device 100B according to the third embodiment of the disclosure. In contrast to the light-emitting diode 200A of the second embodiment, the light-emitting diode 200B in this embodiment includes the first contact 204 and the second contact 206 with different diameters, and the substrate 102 includes the groove 104 and the groove 106 respectively corresponding to the first contact 204 and the second contact 206. In this embodiment, the diameter DC1 of the first contact 204 is greater than the diameter DC2 of the second contact 206. Furthermore, the light-emitting diode 200B further includes a third dielectric layer 212 and a fourth dielectric layer 214. The third dielectric layer 212 is disposed between the main body 202 and the first contact 204, the fourth dielectric layer 214 is disposed between the main body 202 and the second contact 206, and the third dielectric layer 212 and the fourth dielectric layer 214 have different dielectric constants. For example, the dielectric constant of the third dielectric layer 212 is greater than the dielectric constant of the fourth dielectric layer 214.

As shown in FIG. 3, the light-emitting diode 200B is located in the position P1. At this time, the first contact 204 with a large diameter faces the groove 104 with a small size, and the second contact 206 with a small diameter faces the groove 106 with a large size. In order to install the light-emitting diode 200B on the substrate 102, an electric field E2 is applied to the light-emitting diode display device 100B, so that the third dielectric layer 212 and the fourth dielectric layer 214 of the light-emitting diode 200B are induced and polarized due to the electric field E2, and then the third dielectric layer 212 correspondingly generates positive charges, and the fourth dielectric layer 214 correspondingly generates negative charges. Therefore, the polarized light-emitting diode 200B is driven by the electric field E2 to rotate along the XY plane or flip around the Y axis to the position P2 shown in FIG. 4.

After that, the electric field E2 is turned off and the electric field E1 is turned on in FIG. 4, so that the first dielectric layer 208 and the second dielectric layer 210 of the light-emitting diode 200B are induced and polarized. The first dielectric layer 208 correspondingly generates positive charges, and the second dielectric layer 210 correspondingly generates negative charges. Therefore, the polarized light-emitting diode 200B is driven to move along the Y axis toward the substrate 102, so that the first contact 204 and the second contact 206 can be respectively joined with the groove 104 and the groove 106. As a result, the light-emitting diode 200B is installed on the substrate 102.

[The Fourth Embodiment]

Figure 5:
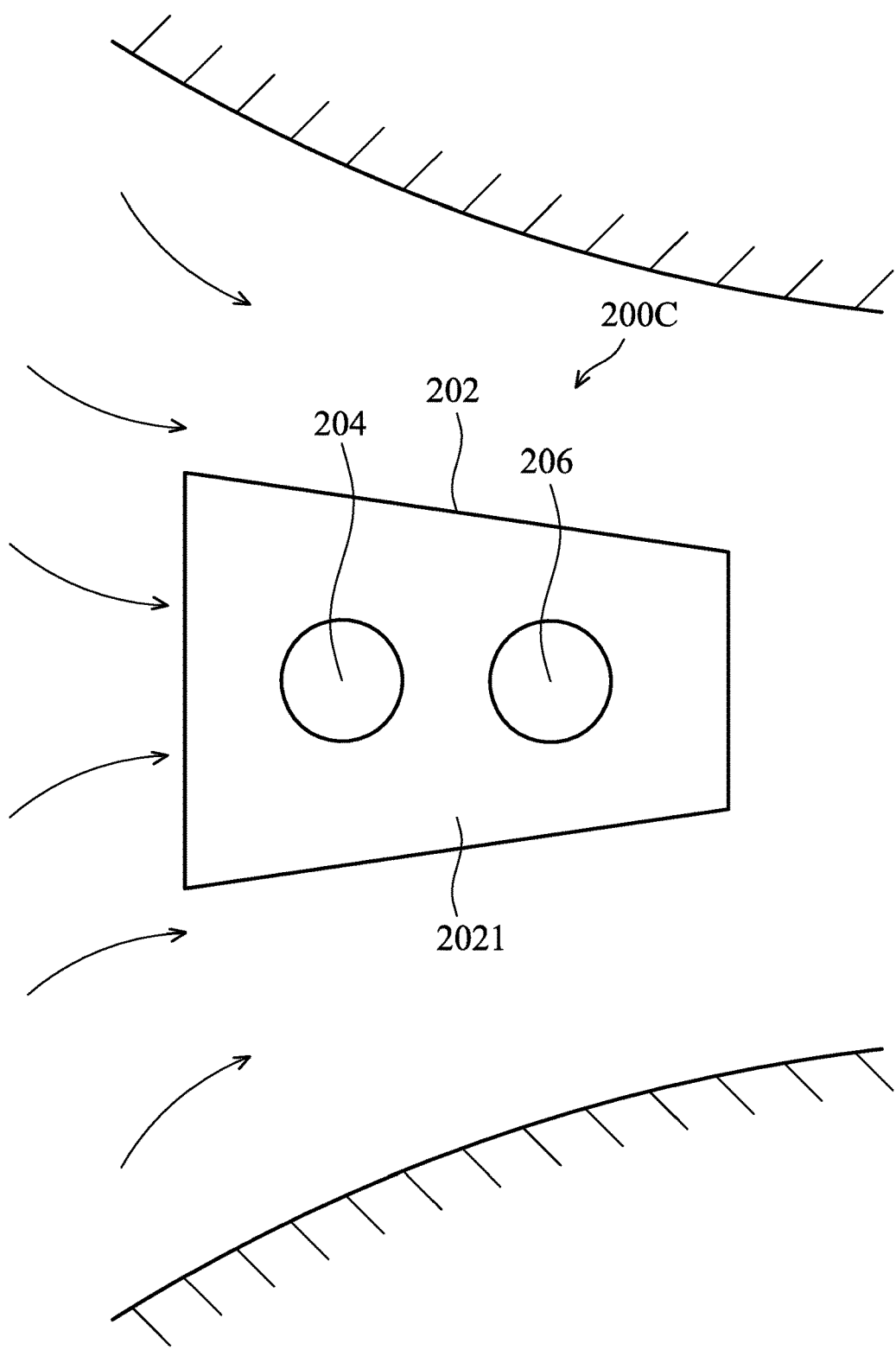
FIG. 5 is a bottom view of a light-emitting diode in a flow path according to the fourth embodiment of the disclosure.

Please refer to FIG. 5, which is a bottom view of a light-emitting diode 200C in a flow path according to the fourth embodiment of the disclosure. The structure of the light-emitting diode 200C is similar to the light-emitting diode 200 in FIG. 1, the difference between the two light-emitting diodes 200 and 200C is that the main body 202 of the light-emitting diode 200C is a trapezoidal structure. The first side 2021 is a trapezoidal surface in a bottom view, and the first contact 204, the second contact 206 and the first dielectric layer 208 are disposed on the first side 2021. Similarly, the second side 2022 is also a trapezoidal surface from a top view.

When the light-emitting diode 200C is disposed in the fluid in the flow path and the flow direction is along the arrows in FIG. 5, the trapezoidal structure of the main body 202 can help the light-emitting diode 200C to stably flow along the direction of the fluid and the light-emitting diode 200C does not rotate or drift. In addition, in other embodiment, the light-emitting diode 200C can also has the first contact 204 and the second contact 206 with different diameters.

[The Fifth Embodiment]

Figure 6:
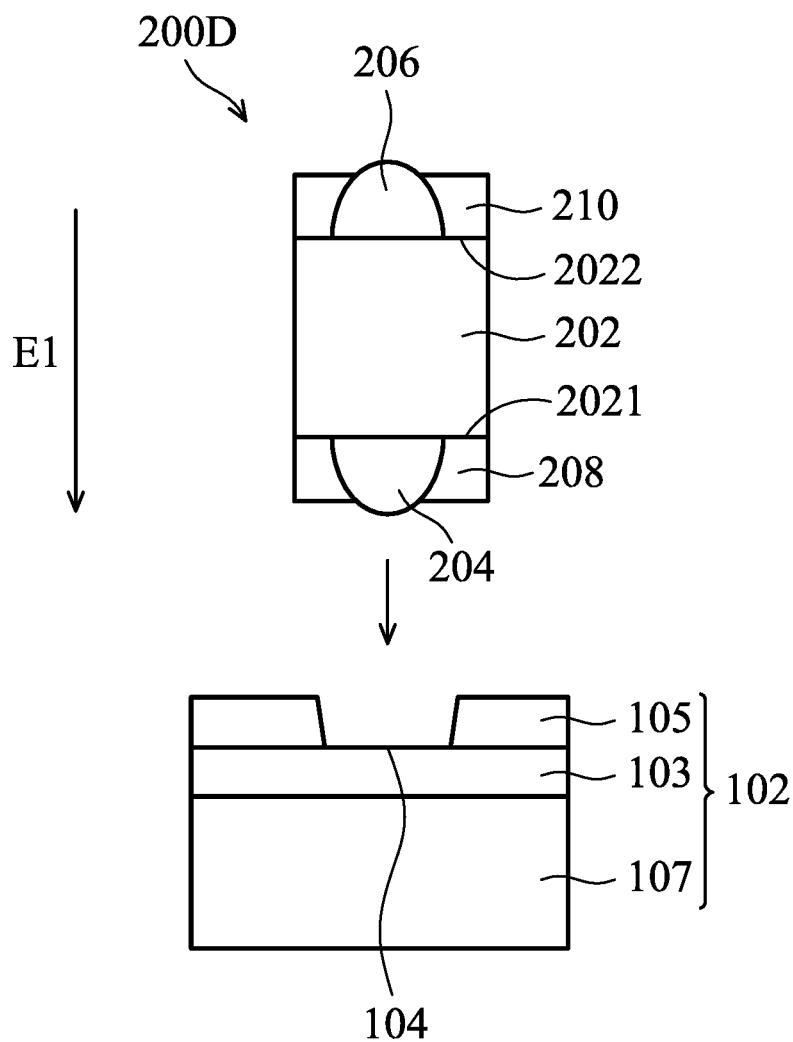
FIG. 6 is a diagram of a light-emitting diode display device according to the fifth embodiment of the disclosure.

Please refer to FIG. 6, which is a diagram of a light-emitting diode display device 100D according to the fifth embodiment of the disclosure. In this embodiment, a light-emitting diode 200D of the light-emitting diode display device 100D is configured to join with the groove 104 of the substrate 102, and the main body 202 of the light-emitting diode 200D includes the first side 2021 and the second side 2022. The first dielectric layer 208 and the first contact 204 are disposed on the first side 2021, and the second dielectric layer 210 and the second contact 206 are disposed on the second side 2022. The first dielectric layer 208 and the second dielectric layer 210 can have different dielectric constants. For example, the dielectric constant of the first dielectric layer 208 is greater than the dielectric constant of the second dielectric layer 210.

When the electric field E1 is applied to the light-emitting diode display device 100D, the first dielectric layer 208 and the second dielectric layer 210 of the light-emitting diode 200D are induced and polarized, so that the first dielectric layer 208 correspondingly generates positive charges, and the second dielectric layer 210 correspondingly generates negative charges. Therefore, the polarized light-emitting diode 200D is driven by the electric field E1 to move toward the groove 104, so that the first contact 204 can join with the groove 104.

[The Sixth Embodiment]

Figure 7:
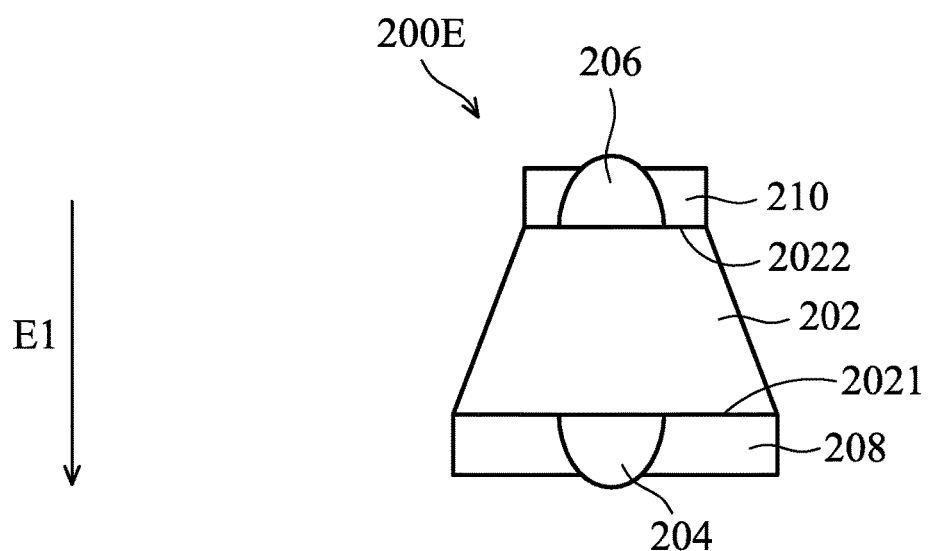
FIG. 7 is a diagram of a light-emitting diode display device according to the sixth embodiment of the disclosure.
Figure 7:
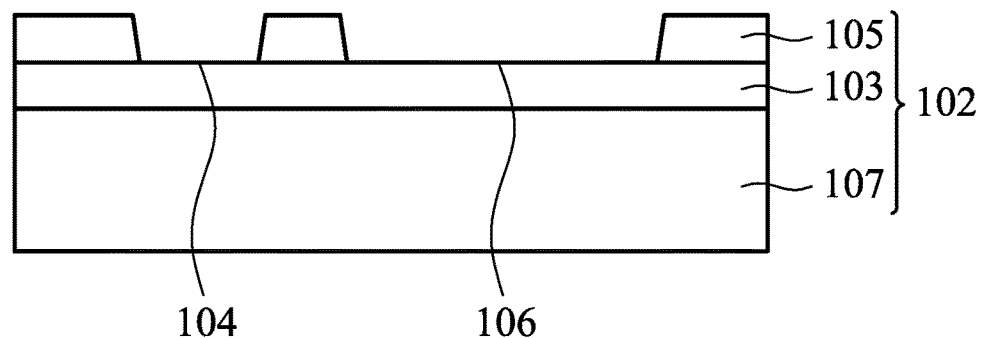

Please refer to FIG. 7, which is a diagram of a light-emitting diode display device 100E according to the sixth embodiment of the disclosure. In this embodiment, the structure of the light-emitting diode 200E of the light-emitting diode display device 100E is similar to the light-emitting diode 200D of the fifth embodiment, the difference is that the main body 202 of the light-emitting diode 200E is a trapezoidal body. The first side 2021 and the second side 2022 of the main body 202 are rectangular surfaces and are parallel to each other. The first dielectric layer 208 and the first contact 204 are disposed on the first side 2021, and the second dielectric layer 210 and the second contact 206 are disposed on the second side 2022. The first dielectric layer 208 and the second dielectric layer 210 can have different dielectric constants.

For example, when it is desired to join the second contact 206 with the corresponding groove 104 using the electric field E1, the dielectric constant of the second dielectric layer 210 needs to be greater than the dielectric constant of the first dielectric layer 208. In addition, when it is desired to join the first contact 204 with the corresponding groove 106 using the electric field E1, the dielectric constant of the first dielectric layer 208 needs to be greater than the dielectric constant of the second dielectric layer 210.

[The Seventh Embodiment]

Figure 8:
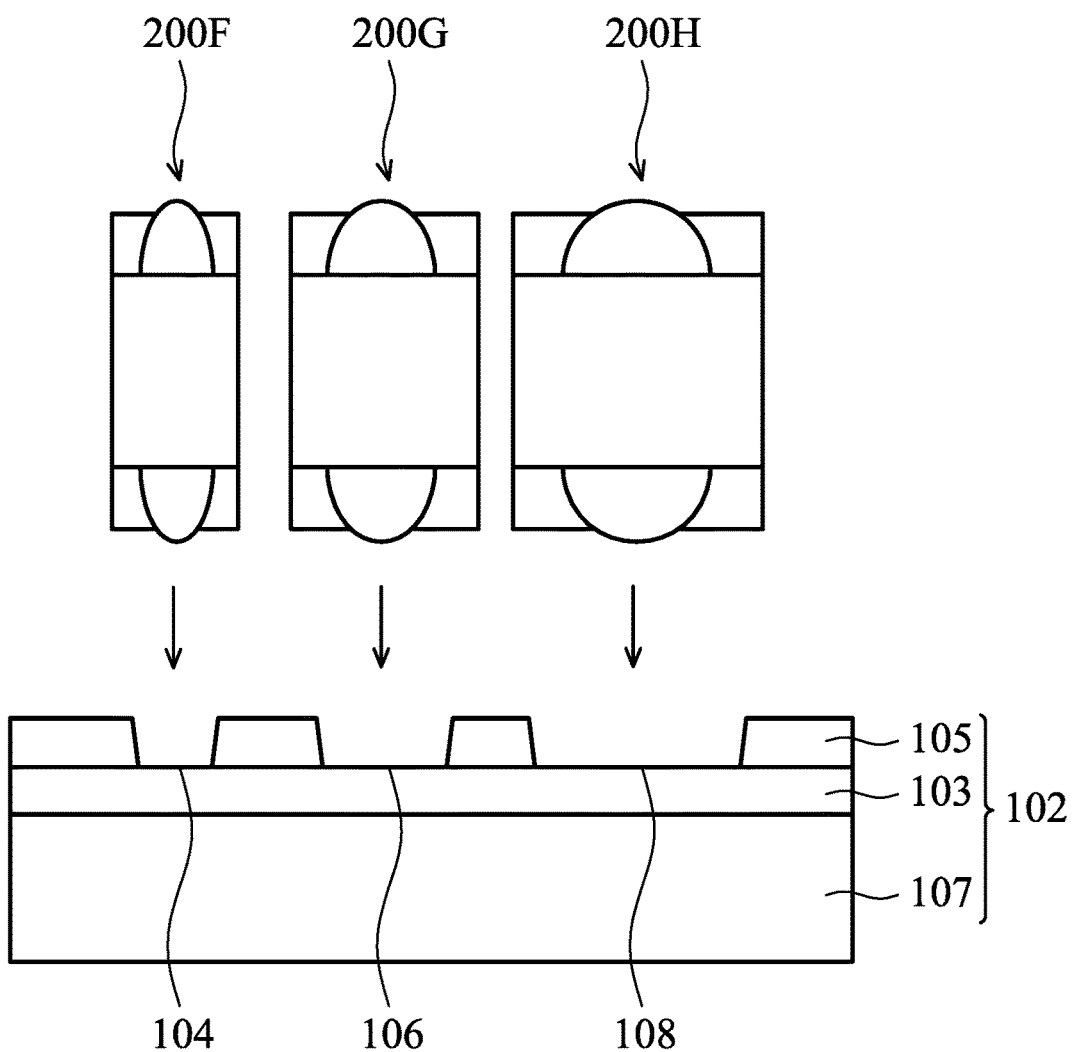
FIG. 8 is a diagram of a light-emitting diode display device according to the seventh embodiment of the disclosure.

Please refer to FIG. 8, which is a diagram of a light-emitting diode display device 100F according to the seventh embodiment of the disclosure. In this embodiment, the light-emitting diode display device 100F can be a sub-pixel of one pixel in a display panel, and the light-emitting diode display device 100F includes a light-emitting diode 200F, a light-emitting diode 200G and a light-emitting diode 200H. The contact areas of the light-emitting diode 200F, light-emitting diode 200G and light-emitting diode 200H with the driving circuit layer 103 are different. They can emit light beams with the same wavelength, or they can be different light-emitting diodes respectively emitting light beams with different wavelengths, such as red light, green light or blue light. The structures of the light-emitting diode 200F, light-emitting diode 200G and light-emitting diode 200H are similar to the light-emitting diode 200D in the fifth embodiment, and the substrate 102 includes a groove 104, a groove 106 and a groove 108 corresponding to the light-emitting diodes 200F, 200G and 200H.

During the fluid self-assembly procedure, the order of installing the light-emitting diodes 200F, 200G and 200H on the corresponding grooves 104, 106 and 108 is according to their size (from the smallest one to the biggest one). For example, the light-emitting diode 200H corresponding to the bigger groove 108 is installed on the groove 108 at first, and then the light-emitting diode 200G is installed on the groove 106. Finally, the light-emitting diode 200F with the smallest size is installed on the groove 104. This order of installation can prevent the light-emitting diode from being installed on a wrong groove in the procedure of installation. For example, if the light-emitting diode 200G is installed first, then the light-emitting diode 200G may join with the groove 108 instead of the corresponding groove 106.

It should be noted that, because the sub-pixel (the light-emitting diode display device 100F) includes three light-emitting diodes 200F, 200G and 200H, if one of the light-emitting diodes is broken, the remaining two light-emitting diodes can serve as substitutes for the broken one and continue to emit light beams.

Figure 9:
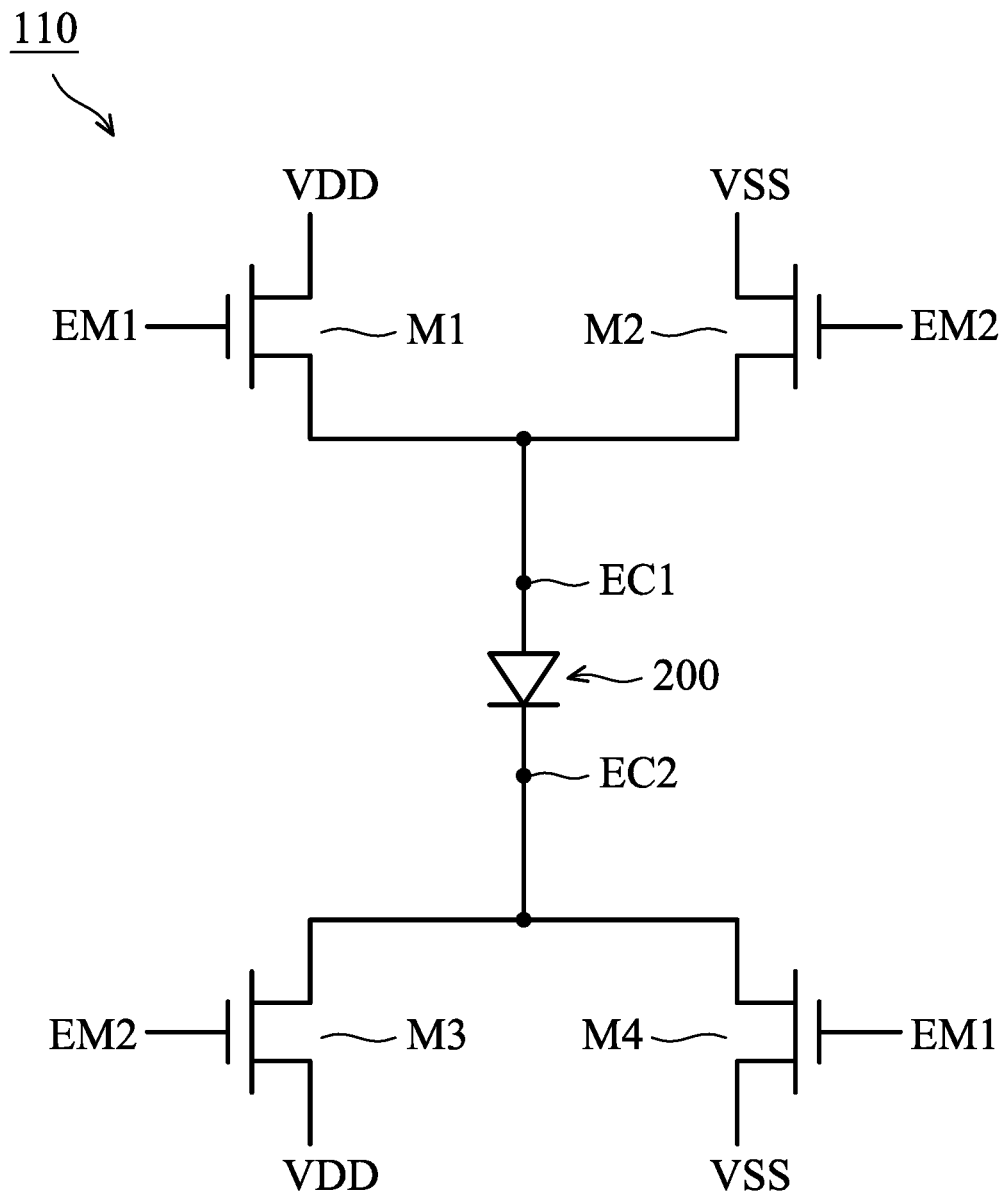
FIG. 9 is a diagram of a first driving circuit according to one embodiment of the disclosure.

Please refer to FIG. 9, which is a diagram of a first driving circuit 110 according to one embodiment of the disclosure. The driving circuit layer 103 includes a plurality of first driving circuits 110, configured to drive the light-emitting diodes. Each of the first driving circuits 110 includes a first transistor M1, a second transistor M2, a third transistor M3, and a fourth transistor M4. A first terminal of the first transistor M1 is electrically connected to a first direct-current voltage VDD, a second terminal of the first transistor M1 is electrically connected to an electrical contact EC1, and a control terminal of the first transistor M1 is electrically connected to a first driving signal EM1. A control terminal of the second transistor M2 is electrically connected to a second driving signal EM2, a first terminal of the second transistor M2 is electrically connected to the second terminal of the first transistor M1, and a second terminal of the second transistor M2 is electrically connected to a second direct-current voltage VSS.

A control terminal of the third transistor M3 is electrically connected to the second driving signal EM2, a first terminal of the third transistor M3 is electrically connected to the first direct-current voltage VDD, and a second terminal of the third transistor M3 is electrically connected to an electrical contact EC2. A control terminal of the fourth transistor M4 is electrically connected to the first driving signal EM1, a first terminal of the fourth transistor M4 is electrically connected to the second terminal of the third transistor M3, and a second terminal of the fourth transistor M4 is electrically connected to the second direct-current voltage VSS. The first direct-current voltage VDD is greater than the second direct-current voltage VSS, and the first driving signal EM1 and the second driving signal EM2 are square wave signals and complementary signals.

Take the first embodiment for example, the electrical contact EC1 can be an electrical contact disposed in the groove 104, and the electrical contact EC2 can be an electrical contact in the groove 106. The first contact 204 of the light-emitting diode 200 can be the positive electrode configured to be electrically connected to the electrical contact EC1, and the second contact 206 can be the negative electrode configured to be electrically connected to the electrical contact EC2. In this configuration, when the first driving signal EM1 is at a high voltage level, the first transistor M1 and the fourth transistor M4 are turned on, so as to drive the light-emitting diode 200 to emit the light.

Conversely, during the fluid self-assembly procedure, the positive electrode (first contact 204) of the light-emitting diode 200 may be electrically connected to the electrical contact EC2, and the negative electrode (second contact 206) may be electrically connected to the electrical contact EC1. In this configuration, when the second driving signal EM2 is at a high voltage level, the third transistor M3 and the second transistor M2 are turned on, so that the light-emitting diode 200 is driven to emit the light. It can be known according to the description above that when the first contact 204 and the second contact 206 of the light-emitting diode 200 are respectively electrically connected to the electrical contact EC1 and the electrical contact EC2, the light-emitting diode 200 is driven by the first driving circuit 110 to emit the light, and when the first contact 204 and the second contact 206 are respectively electrically connected to the electrical contact EC2 and the electrical contact EC1, the light-emitting diode 200 is driven by the first driving circuit 110 to emit the light as well.

Figure 10:
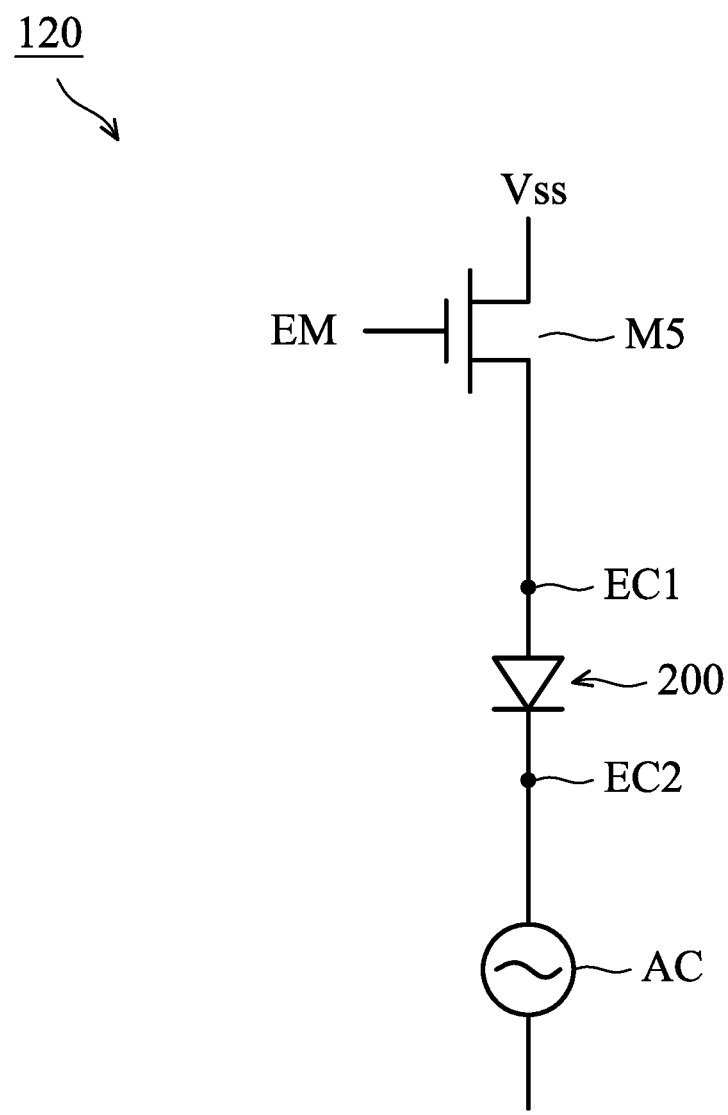
FIG. 10 is a diagram of a second driving circuit according to another embodiment of the disclosure.

Please refer to FIG. 10, which is a diagram of a second driving circuit 120 according to another embodiment of the disclosure. In this embodiment, the driving circuit layer 103 can include a plurality of second driving circuits 120, configured to drive the light-emitting diodes. Each of the second driving circuits 120 includes a fifth transistor M5 which has a control terminal, a first terminal and a second terminal. The control terminal of the fifth transistor M5 is electrically connected to a driving signal EM, the first terminal of the fifth transistor M5 is electrically connected to a direct-current voltage (such as the second direct-current voltage VSS), the second terminal of the fifth transistor M5 is electrically connected to the electrical contact EC1, and the electrical contact EC2 is electrically connected to an alternating-current voltage AC.

Similarly, take the first embodiment for example, the electrical contact EC1 can be an electrical contact disposed in the groove 104, and the electrical contact EC2 can be an electrical contact in the groove 106. The first contact 204 of the light-emitting diode 200 can be the positive electrode configured to be electrically connected to the electrical contact EC1, and the second contact 206 can be the negative electrode configured to be electrically connected to the electrical contact EC2. In this configuration, when the driving signal EM is at a high voltage level and the second direct-current voltage VSS is greater than a voltage level of the alternating-current voltage AC, the fifth transistor M5 is turned on, so as to drive the light-emitting diode 200 to emit the light.

Conversely, during the fluid self-assembly procedure, the positive electrode (first contact 204) of the light-emitting diode 200 may be electrically connected to the electrical contact EC2, and the negative electrode (second contact 206) may be electrically connected to the electrical contact EC1. In this configuration, when the driving signal EM is at a high voltage level and the second direct-current voltage VSS is less than the voltage level of the alternating-current voltage AC, the fifth transistor M5 is turned on, so that the light-emitting diode 200 is driven to emit the light. It can be known according to the description above that when the first contact 204 and the second contact 206 of the light-emitting diode 200 are respectively electrically connected to the electrical contact EC1 and the electrical contact EC2, the light-emitting diode 200 is driven by the second driving circuit 120 to emit the light, and when the first contact 204 and the second contact 206 are respectively electrically connected to the electrical contact EC2 and the electrical contact EC1, the light-emitting diode 200 is driven by the second driving circuit 120 to emit the light as well.

[The Eighth Embodiment]

Figure 11:
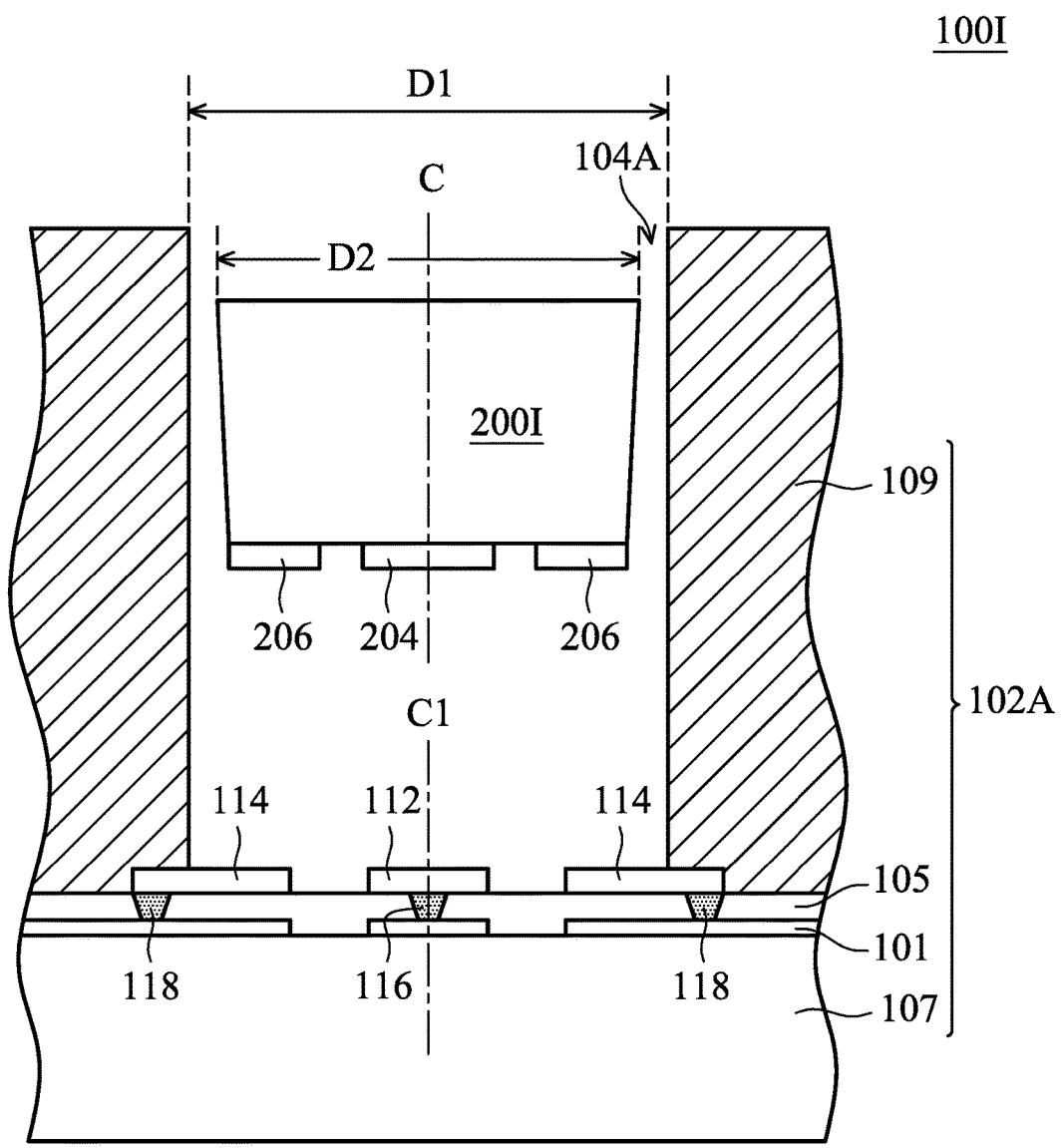
FIG. 11 is a diagram of a light-emitting diode display device according to the eighth embodiment of the disclosure.

Please refer to FIG. 11, which is a diagram of a light-emitting diode display device 100I according to the eighth embodiment of the disclosure. In this embodiment, the light-emitting diode 200I can include a plurality of light-emitting diodes 200I and a substrate 102A. Only one light-emitting diode 200I and a groove 104A on the substrate 102A are illustrated in FIG. 11 for simplicity. The light-emitting diode 200I includes a first contact 204 and a second contact 206. The first contact 204 is disposed on the bottom of the light-emitting diode 200I, and the central axis C of the light-emitting diode 200I is extended through the first contact 204. The second contact 206 is disposed on the bottom of the light-emitting diode 200I and is spaced apart from the central axis C by a distance. In this embodiment, the first contact 204 is the positive electrode of the light-emitting diode 200I, and the width of the first contact 204 can be 13 μm, but it is not limited thereto. The second contact 206 is disposed on two sides of the first contact 204, and the width of the second contact 206 can be 9 μm. The distance between the second contact 206 and the first contact 204 is 4 μm, but it is not limited thereto.

Figure 12:
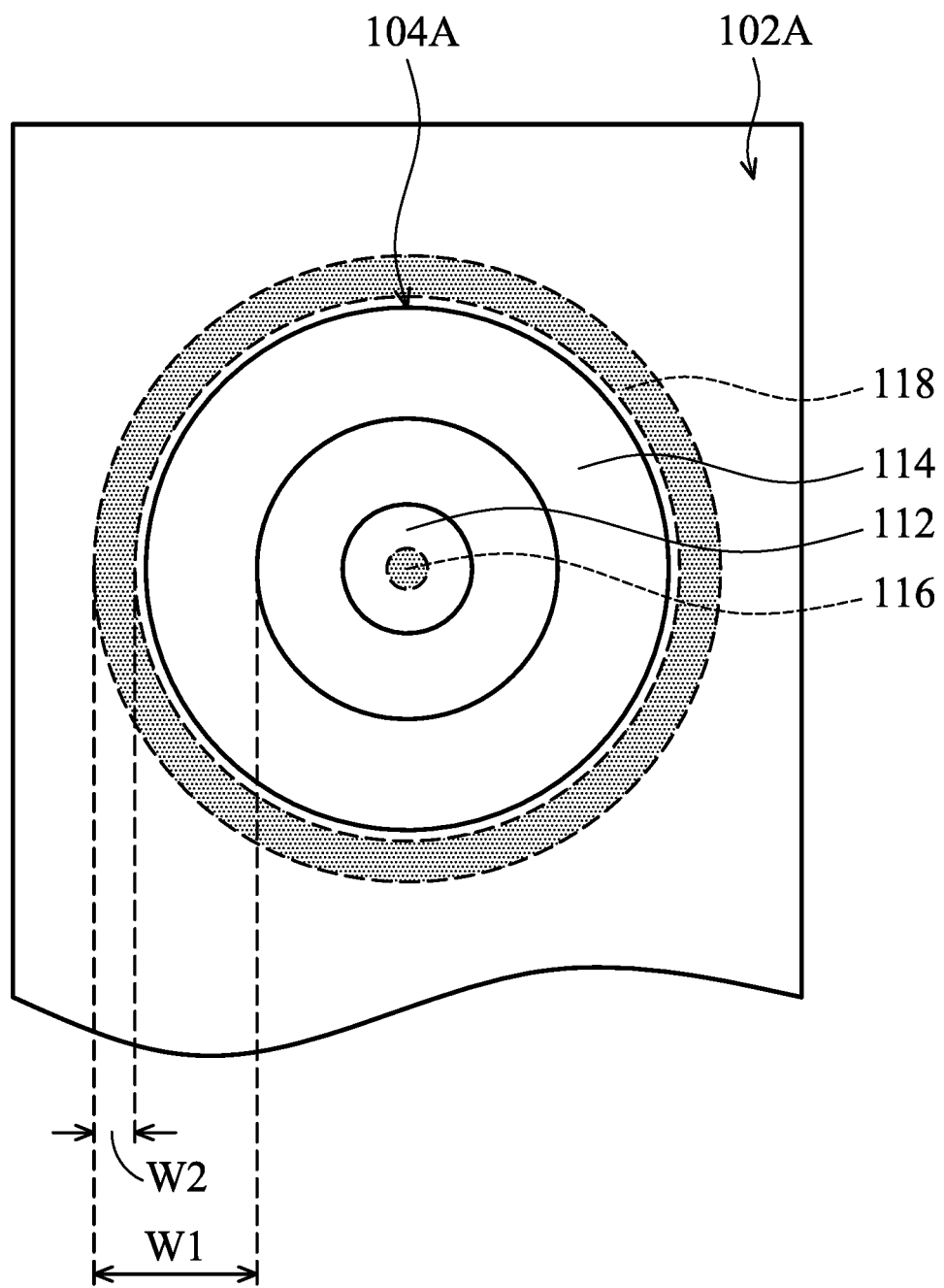
FIG. 12 is a top view of a substrate and a groove in FIG. 11.

Please refer to FIG. 11 and FIG. 12. FIG. 12 is a top view of the substrate 102A and the groove 104A in FIG. 11. The substrate 102A can include a metal layer 101, an insulation layer 105, a bottom layer 107 and a side wall structure 109. The metal layer 101 is disposed on the bottom layer 107 and is electrically connected to a driving circuit (not shown in the figures), and the insulation layer 105 is disposed on the metal layer 101. The side wall structure 109 can form the groove 104A, which is on the insulation layer 105 to contain the light-emitting diode 200I. A first connecting portion 112 and a second connecting portion 114 are disposed in the groove 104A. As shown in FIG. 12, when viewed along the central axis C, the first connecting portion 112 is a circular structure and is positioned on the center of the groove 104A. The second connecting portion 114 is a ring structure which surrounds the first connecting portion 112. The first connecting portion 112 is configured to be electrically connected to the first contact 204, and the second connecting portion 114 is configured to be electrically connected to the second contact 206. In this embodiment, the distance between the first connecting portion 112 and the second connecting portion 114 can be 7.3 μm, but it is not limited thereto.

In addition, the substrate 102A further includes a first through hole 116 and a second through hole 118. The first through hole 116 penetrates the insulation layer 105, and a conductive material is disposed in the first through hole 116, such as titanium, but it is not limited thereto. The first through hole 116 is configured to be electrically connected to the first connecting portion 112 and the metal layer 101. The second through hole 118 penetrates the insulation layer 105, and a conductive material is disposed in the second through hole 118, such as titanium. The second through hole 118 is configured to be electrically connected to the second connecting portion 114 and the metal layer 101. In this embodiment, the center of curvature of the first connecting portion 112 is located in the first through hole 116. The second through hole 118 is a ring structure when viewed along the central axis C (as shown in FIG. 12). The width W2 of the second through hole 118 is less than the width W1 of the second connecting portion 114, and the second through hole 118 is close to the outside of the second connecting portion 114.

During the fluid self-assembly procedure, the light-emitting diode 200I enters the groove 104A, so that the first contact 204 and the second contact 206 are respectively in contact with the first connecting portion 112 and the second connecting portion 114. As a result, the light-emitting diode 200I can be electrically connected to the driving circuit (not shown in the figures), so that the driving circuit drives the light-emitting diode 200I to emit the light.

It should be noted that the diameter D1 (such as 45.7 μm) of the groove 104A is greater than the diameter D2 (such as 41 μm) of the light-emitting diode 200I. Therefore, when the light-emitting diode 200I enters the groove 104A, the central axis C of the light-emitting diode 200I may diverge from the central axis C1 of the groove 104A. However, because of the structural design of this embodiment, the first contact 204 and the second contact 206 can still be respectively connected to the first connecting portion 112 and the second connecting portion 114, and the first contact 204 does not contact the second connecting portion 114 and the second contact 206 does not contact the first connecting portion 112.

[The Ninth Embodiment]

Figure 13:
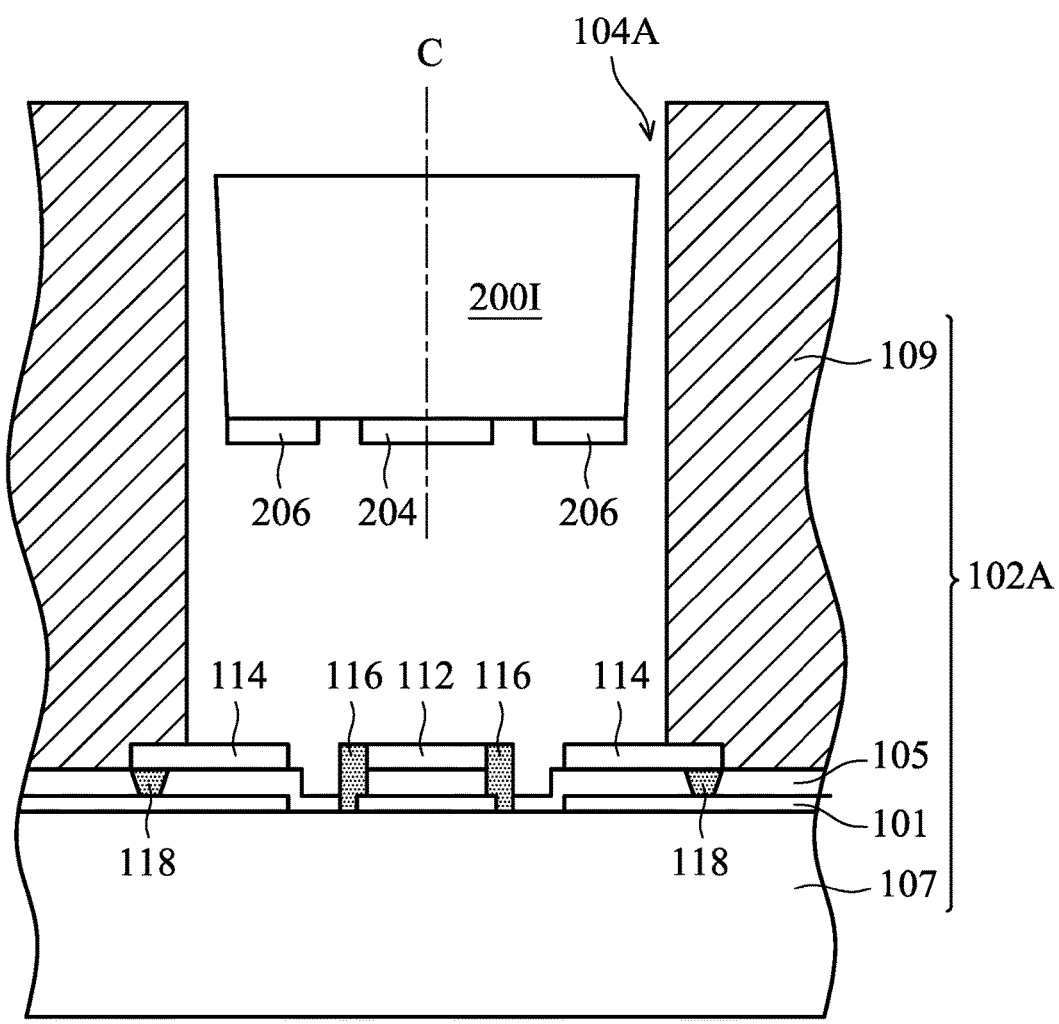
FIG. 13 is a diagram of a light-emitting diode display device according to the ninth embodiment of the disclosure.
Figure 14:
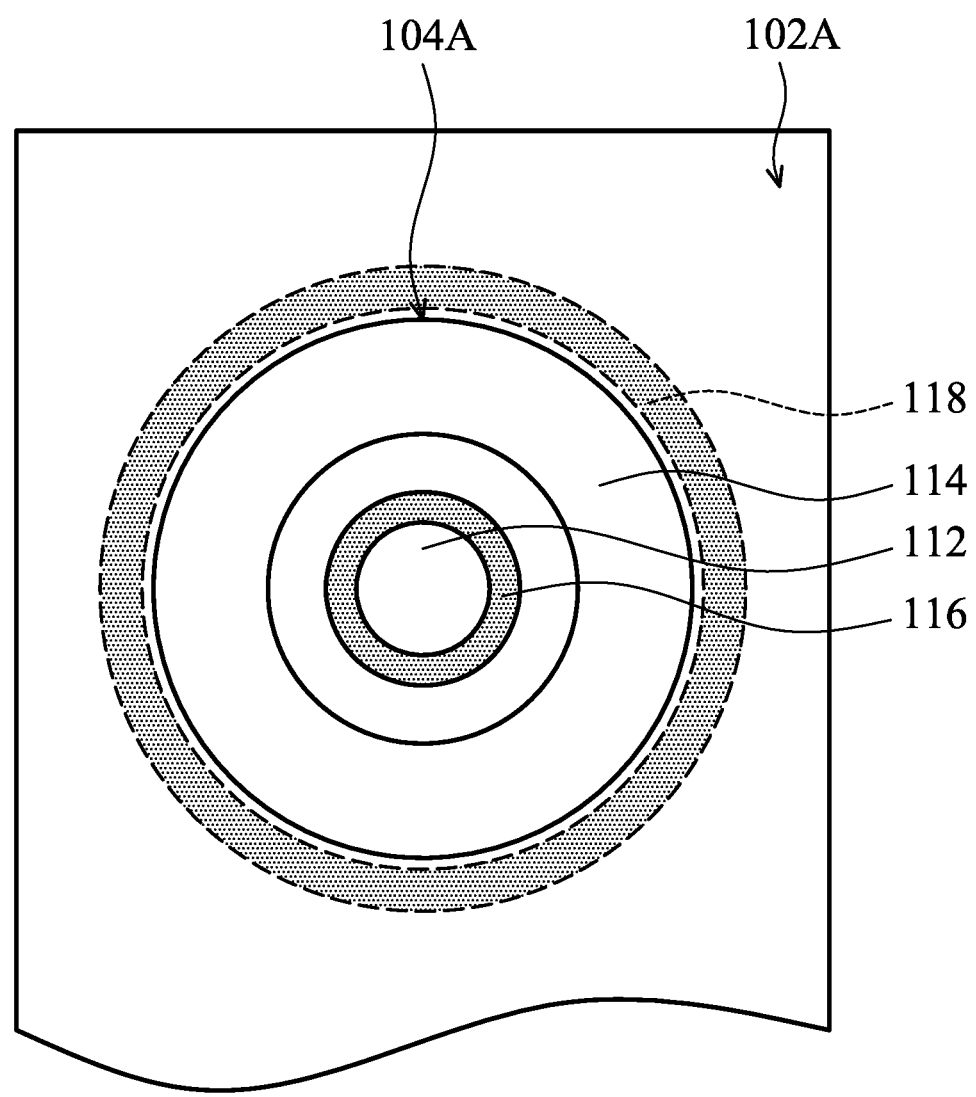
FIG. 14 is a top view of a substrate and a groove in FIG. 13.

Please refer to FIG. 13 and FIG. 14. FIG. 13 is a diagram of a light-emitting diode display device 100J according to the ninth embodiment of the disclosure. FIG. 14 is a top view of the substrate 102A and the groove 104A in FIG. 13. The structure of the light-emitting diode display device 100J in this embodiment is similar to the structure of the light-emitting diode display device 100I in the eighth embodiment. The difference is that the first through hole 116 and the conductive material thereof are ring structures when viewed along the central axis C, which are configured to surround the first connecting portion 112. The contact area of the first contact 204 of the light-emitting diode 200I and the first connecting portion 112 is increased due to this structural design, so as to increase the transmission efficiency of signals between the light-emitting diode 200I and the driving circuit.

[The Tenth Embodiment]

Figure 15:
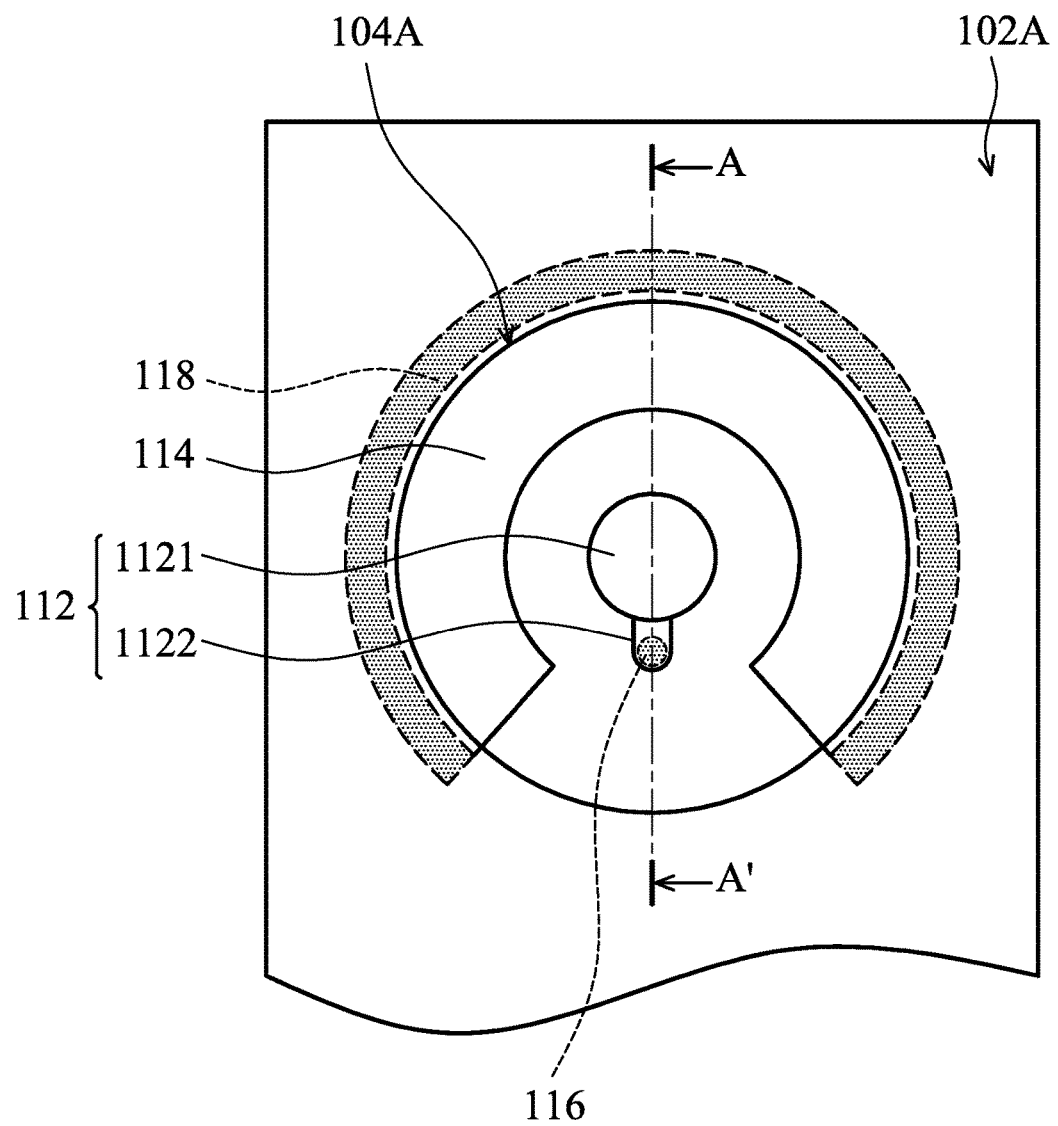
FIG. 15 is a top view of the substrate and the groove according to the tenth embodiment of the disclosure.
Figure 16:
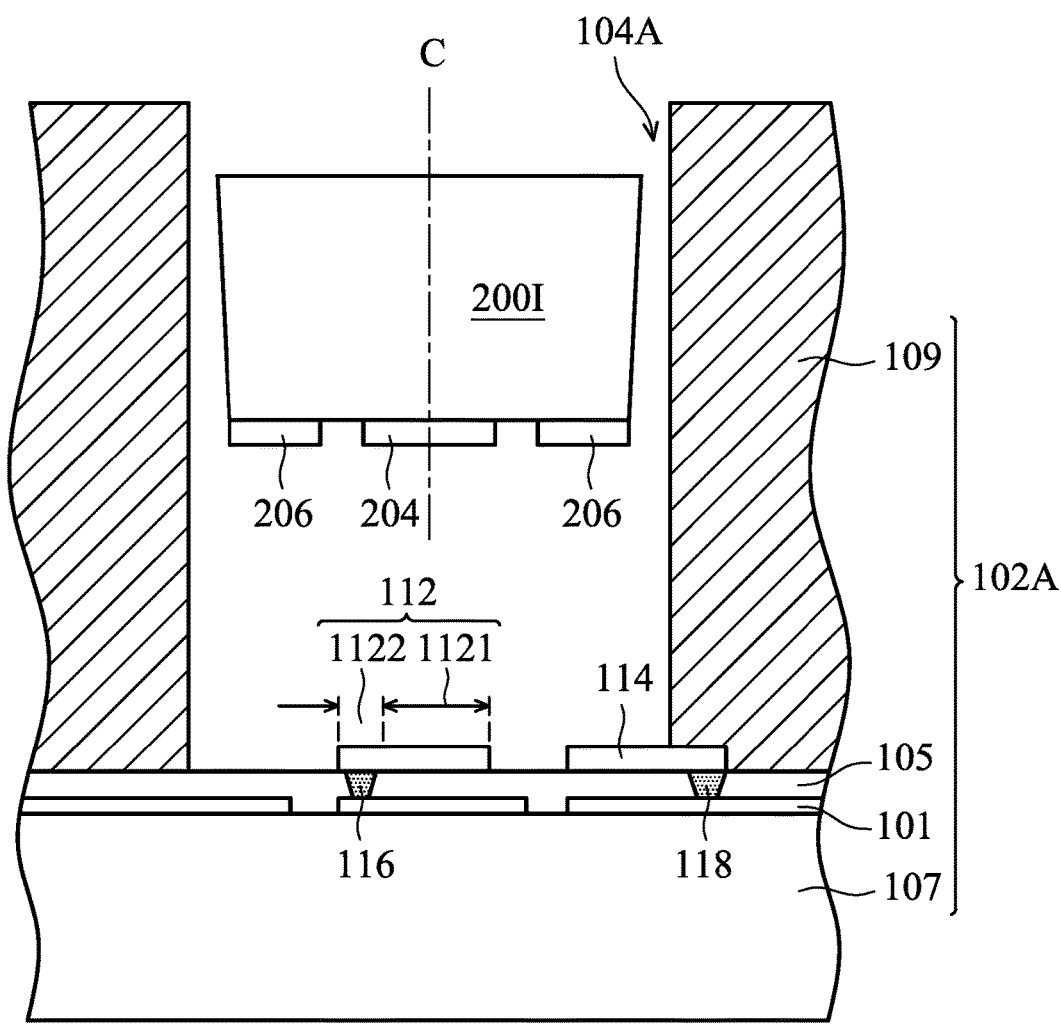
FIG. 16 is a sectional view along line A-A' in FIG. 15.

Please refer to FIG. 15 and FIG. 16. FIG. 15 is a top view of the substrate 102A and the groove 104A according to the tenth embodiment of the disclosure. FIG. 16 is a sectional view along line A-A' in FIG. 15. The structure of the light-emitting diode display device 100K in FIG. 16 is similar to the structure of the light-emitting diode display device 100I in the eighth embodiment. The difference is that the first connecting portion 112 includes a circular portion 1121 and a protruding portion 1122 which are connected to each other. The second connecting portion 114 and the second through hole 118 are arc structures when viewed along the central axis C, and the angle of the arc structures relative to the central axis C is greater than 180 degrees. Furthermore, as shown in FIG. 15, the protruding portion 1122 protrudes from the circular portion 1121 toward a notch in the arc structure, and the first through hole 116 is disposed under the protruding portion 1122. The contact area of the first contact 204 of the light-emitting diode 200I and the first connecting portion 112 is increased due to this structural design, so as to increase the transmission efficiency of signals between the light-emitting diode 200I and the driving circuit.

[The Eleventh Embodiment]

Figure 17:
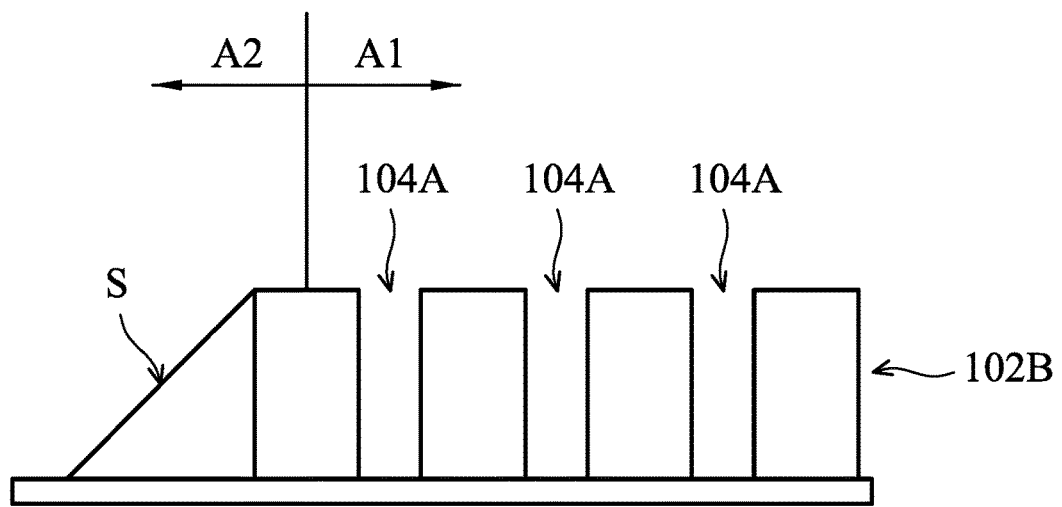
FIG. 17 is a sectional view of a substrate according to the eleventh embodiment of the disclosure.

Please refer to FIG. 17, which is a sectional view of a substrate 102B according to the eleventh embodiment of the disclosure. In this embodiment, the substrate 102B includes an active area A1 and a non-active area A2. The plurality of grooves 104A are formed in the active area A1, and the substrate 102B further includes a ramp structure S disposed adjacent to a boundary of the non-active area A2 and the active area A1. During the fluid self-assembly procedure, the light-emitting diodes are guided by the ramp structure S to smoothly move from the non-active area A2 to the active area A1, and then the light-emitting diodes enter the grooves 104A.

[The Twelfth Embodiment]

Figure 18:
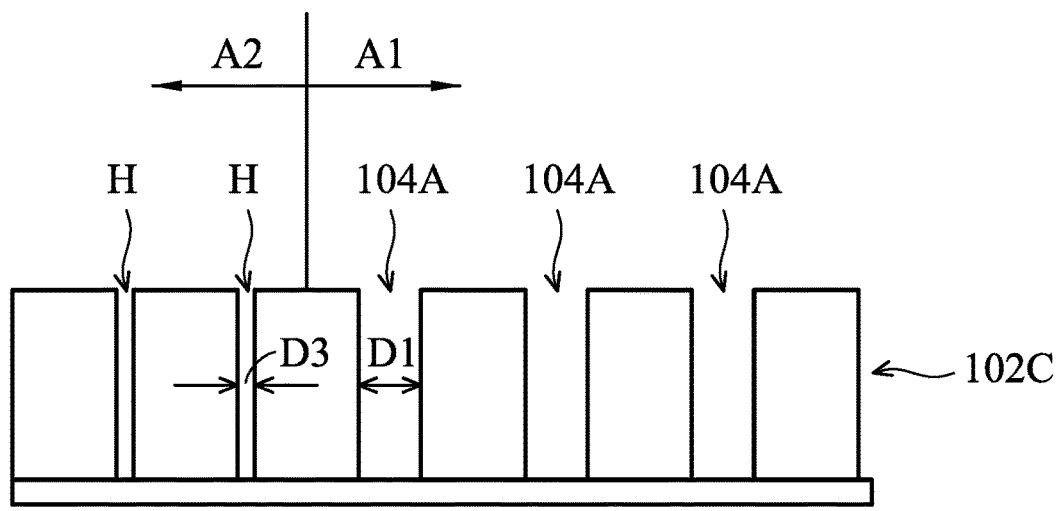
FIG. 18 is a sectional view of a substrate according to the twelfth embodiment of the disclosure.

Please refer to FIG. 18, which is a sectional view of a substrate 102C according to the twelfth embodiment of the disclosure. Similar to the eleventh embodiment, the substrate 102C includes an active area A1 and a non-active area A2. The substrate 102C further includes at least one hole H disposed in the non-active area A2 of the substrate 102C, and the diameter D3 of the hole H is less than the diameter (diameter D1) of the groove 104A. During the fluid self-assembly procedure, the light-emitting diode moves from the non-active area A2 to the active area A1. The diameter of light-emitting diode (such as diameter D2) is slightly less than the diameter D1 and greater than the diameter D3 of the hole H, so that the light-emitting diode enters the groove 104A instead of falling in the hole H when the light-emitting diode moves.

Those light-emitting diode display devices provided in this disclosure can be applied to a display product served as a light source of the display product.

In conclusion, the disclosure provides a light-emitting diode display device applied to a display. The light-emitting diode display device includes a substrate having a plurality of grooves and a plurality of micro-light-emitting diodes. Each of the micro-light-emitting diodes can include at least one dielectric layer, so that the micro-light-emitting diode can be driven by an external electric field to move toward the corresponding groove during the fluid self-assembly procedure, so that the micro-light-emitting diode is correctly installed in the corresponding groove. The main body of the micro-light-emitting diode can also be a cuboid or a trapezoid, and the micro-light-emitting diode can be more accurately installed in the corresponding groove on the substrate due to this structural design.

In addition, a connecting pad in the groove (such as the first connecting portion 112) corresponding to the positive electrode of the micro-light-emitting diode can be configured to be a circular structure, and a connecting pad in the groove (such as the second connecting portion 114) corresponding to the negative electrode of the micro-light-emitting diode can be configured to be a ring structure, so that the positive electrode and the negative electrode of the micro-light-emitting diode can correctly contact the corresponding connecting pads when the micro-light-emitting diode is installed in the groove.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A light-emitting diode display device, comprising: a light-emitting diode, including a central axis; and a substrate including a bottom layer; a first connecting portion disposed on a same side of the bottom layer, wherein the central axis of the light-emitting diode is extended through the first connecting portion; a second connecting portion disposed on the same side of the bottom layer, wherein the second connecting portion is disposed outside of the first connecting portion and is spaced apart from the first connecting portion by a distance which is greater than zero, and the first connecting portion and the second connecting portion are respectively electrically connected to the light-emitting diode; a metal layer disposed on the same side of the bottom layer; and an insulation layer, disposed on the metal layer and being in direct contact with the bottom layer, wherein the metal layer and the insulation layer are extended along a direction which is perpendicular to the central axis; wherein the metal layer is electrically connected to the first connecting portion and the second connecting portion via through holes.

2. The light-emitting diode display device as claimed in claim 1, wherein the substrate further includes a groove, configured to contain the light-emitting diode.

3. The light-emitting diode display device as claimed in claim 1, wherein the substrate further includes:
a first through hole, penetrating the insulation layer, wherein the first through hole is configured to connect the first connecting portion and the metal layer; and
a second through hole, penetrating the insulation layer, wherein the second through hole is configured to connect the second connecting portion and the metal layer.

4. The light-emitting diode display device as claimed in claim 3, wherein a center of curvature of the first connecting portion is located in the first through hole.

5. The light-emitting diode display device as claimed in claim 4, wherein the second connecting portion is a ring structure when viewed along the central axis, the second through hole is a ring structure when viewed along the central axis, the width of the second through hole is less than the width of the second connecting portion, and the second through hole is close to the outside of the second connecting portion.

6. The light-emitting diode display device as claimed in claim 1, wherein the first connecting portion includes a circular portion and a protruding portion, and the first through hole is disposed under the protruding portion.

7. The light-emitting diode display device as claimed in claim 6, wherein the second connecting portion is an arc structure when viewed along the central axis, and the protruding portion protrudes from the circular portion toward a notch in the arc structure.

8. The light-emitting diode display device as claimed in claim 1, wherein the substrate includes a ramp structure adjacent to a boundary of a non-active area and an active area of the substrate.

9. The light-emitting diode display device as claimed in claim 1, wherein the substrate further includes at least one hole and a groove, the hole is disposed in a non-active area of the substrate, the groove is disposed in an active area of the substrate, and the diameter of the hole is less than the diameter of the groove.

* * * * *